United States Patent
Hara et al.

[19]

[11] Patent Number: 5,930,163
[45] Date of Patent: Jul. 27, 1999

[54] SEMICONDUCTOR MEMORY DEVICE HAVING TWO P-WELL LAYOUT STRUCTURE

[75] Inventors: Hiroyuki Hara, Fujisawa, Japan; Masataka Matsui, San Jose, Calif.

[73] Assignee: Kabushiki Kaisha Toshiba, Tokyo, Japan

[21] Appl. No.: 08/993,180

[22] Filed: Dec. 18, 1997

[30] Foreign Application Priority Data

Dec. 19, 1996  [JP]  Japan .................................. 8-339345

[51] Int. Cl.⁶ .................................................. G11C 11/00
[52] U.S. Cl. ............................................ 365/154; 257/903
[58] Field of Search .................................. 365/154, 156; 257/903, 904

[56] References Cited

U.S. PATENT DOCUMENTS 5,754,468  5/1998  Hobson .................................. 365/154

*Primary Examiner*—David Nelms
*Assistant Examiner*—David Lam
*Attorney, Agent, or Firm*—Loeb & Loeb LLP

[57] ABSTRACT

This invention relates to P- and N-well regions where inverters constituting an SRAM cell are formed. The P-well region is divided into two parts, which are laid out on the two sides of the N-well region. Boundaries (BL11, BL12) are formed to run parallel to bit lines (BL, /BL). With this layout, diffusion layers (ND1, ND2) within the P-well regions can be formed into simple shapes free from any bent portion, reducing the cell area.

13 Claims, 17 Drawing Sheets

CELL BOUNDARY
 CONTACT
 VIA 1
 VIA 2
 CONTACT + VIA 1
 VIA 1 + VIA 2
 CONTACT + VIA 1 + VIA 2
  DIFFUSION LAYER
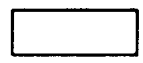 POLYSILICON WIRING LAYER
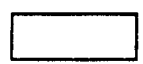 METAL WIRING LAYER 1
  METAL WIRING LAYER 2
 METAL WIRING LAYER 3

CELL BOUNDARY
 CONTACT
VIA 1
VIA 2
CONTACT + VIA 1
VIA 1 + VIA 2
CONTACT + VIA 1 + VIA 2
  DIFFUSION LAYER
POLYSILICON WIRING LAYER
METAL WIRING LAYER 1
FIG. 6(c) METAL WIRING LAYER 2
METAL WIRING LAYER 3

FIG. 9(a)

☐ CELL BOUNDARY
▨ CONTACT
▧ VIA 1
▨ VIA 2
▧ CONTACT + VIA 1
▨ VIA 1 + VIA 2
▨ CONTACT + VIA 1 + VIA 2

FIG. 9(b)

▨ DIFFUSION LAYER
☐ POLYSILICON WIRING LAYER
☐ METAL WIRING LAYER 1

FIG. 9(c)

☐ METAL WIRING LAYER 2
▨ METAL WIRING LAYER 3

CELL BOUNDARY

CONTACT

VIA 1

VIA 2

CONTACT + VIA 1

VIA 1 + VIA 2

CONTACT + VIA 1 + VIA 2

DIFFUSION LAYER

POLYSILICON WIRING LAYER

METAL WIRING LAYER 1

METAL WIRING LAYER 2

METAL WIRING LAYER 3

SEMICONDUCTOR MEMORY DEVICE HAVING TWO P-WELL LAYOUT STRUCTURE

BACKGROUND OF THE INVENTION

The present invention relates to a semiconductor memory device and, more particularly, to the layout of an SRAM (Static Random Access Memory) cell having a CMOS structure.

An SRAM having a CMOS structure is widely used as a memory device integrated in a logical IC. As a memory element constituting the memory device, the most basic one is a 1-port memory cell (SRAM cell) shown in FIG. 16, which is constituted by six transistors.

A P-channel MOS transistor P1 and an N-channel MOS transistor N1 constitute an inverter IN2 in FIG. 17 showing an equivalent circuit, whereas a P-channel MOS transistor P2 and an N-channel MOS transistor N2 constitute an inverter IN1. The inverters IN1 and IN2 have a relationship in which their input and output terminals are cross-connected to each other. The output terminal of the inverter IN1 and the input terminal of the inverter IN2 are connected to a bit line BL via a transfer gate transistor N3. The input terminal of the inverter IN1 and the output terminal of the inverter IN2 are connected to a bit line /BL via a transfer gate transistor N4. The gates of the transistors N3 and N4 are connected to a word line WL.

This 6-transistor memory cell has a layout like the one shown in FIGS. 10 and 11 showing the layout of a device associated with the present invention. FIG. 10 shows an underlying layer including a diffusion layer formed on a substrate surface to constitute a transistor, a polysilicon wiring layer formed on the upper surface of the diffusion layer, and a first metal wiring layer 1 formed on the upper surface of the polysilicon wiring layer. FIG. 11 shows an overlying layer including second and third metal wiring layers 2 and 3 formed on the upper surface of the underlying layer. FIG. 12(a) shows the marks of a contact and a via hole used in FIGS. 10 and 11; FIG. 12(b), those of the diffusion layer, the polysilicon film, and the metal wiring layer 1; and FIG. 12(c), those of the metal wiring layers 2 and 3.

A boundary BL11 between an N-well region where the P-channel MOS transistors P1 and P2 shown in FIG. 10 are formed, and a P-well region where the N-channel MOS transistors N1 to N4 are formed is present parallel to the word line WL shown in FIG. 11. At an upper portion with respect to the line A—A parallel to the boundary BL11, a polysilicon wiring layer PL11 connected to the gate of the transistor P1 and a polysilicon wiring layer PL12 connected to the gate of the transistor P2 are laid out translationally symmetrical to each other.

At a lower portion with respect to the line A—A, a diffusion layer DR11 constituting the transistors N1 and N3 and a diffusion layer DR12 constituting the transistors N2 and N4 are laid out mirror-symmetrical about the y-axis perpendicular to the word line WL.

As is apparent from FIG. 10, in this layout, the ground line GND and the word line WL are formed of the metal wiring layers 3, the bit lines BL and /BL are formed of the metal wiring layers 2, and all the remaining portions are made of the polysilicon wiring layers PL11 and PL12 and the metal wiring layer 1. The metal wiring layer 3 is functionally unnecessary because the word line WL made of the polysilicon wiring layers PL11 and PL12 is connected across the memory cell to a word line WL of another adjacent memory cell. The ground line GND can be made of the metal wiring layer 2 to be parallel to the bit lines BL and /BL. Therefore, the layout shown in FIGS. 10 and 11 can be constituted by the polysilicon wiring layers PL11 and PL12 and the metal wiring layers 1 and 2.

This layout is constituted with the minimum area so as to make the design standards (design rule) limited by process techniques satisfy the following conditions.

(a1) The number of metal wiring layers is limited to one or two.

(a2) The design rules of the minimum line width and minimum interval of the metal wiring layer are larger (about two times) than those of the polysilicon layer.

(a3) A contact hole serving as an opening portion between the diffusion layer or the polysilicon wiring layer and the metal wiring layer 1, and the first through hole or first via hole serving as an opening portion between the metal wiring layers 1 and 2 do not directly vertically overlap each other. Since the area of the contact hole is as large as about two times the minimum line width of a normal metal wiring layer, many contact holes or through holes are not formed within the cell to prevent an increase in cell area.

(a4) The boundary between the N- and P-well regions is present between the P-channel MOS transistor and the N-channel MOS transistor. These well regions having different conductivity types are isolated by element isolation using LOCOS. Therefore, the isolation width between the P- and N-well regions must be set much larger (about four times) than the element isolation width between well regions having the same conductivity type.

To satisfy the above conditions, a wiring layer is made of a polysilicon film as much as possible, and a wasteful region must be effectively utilized such that complicated wiring cross connection is performed in the isolation region between the P- and N-well regions.

However, with the recent advance in process techniques, the design rule is changing as follows.

Along with practical use of chemical mechanical polishing (CMP), a technique of planarizing a metal wiring layer advances.

(b1) Even if the number of metal wiring layers increases to three or four, the yield does not greatly decrease.

(b2) The design rules of the minimum line width and minimum interval of the metal wiring layer are almost equal to those of the polysilicon layer.

(c2) A borderless contact technique is introduced, and the contact portion can be formed by the same design rule in which its area is equal to the minimum line width of the metal wiring layer. Further, a stacked-via structure in which a contact hole and a through hole are formed to directly vertically overlap each other can be realized.

In addition, element isolation advances from LOCOS to trench isolation (ST1).

(c1) The isolation width between the P- and N-well regions is almost equal to the element isolation width between well regions having the same conductivity type (P-well regions or N-well regions).

Owing to the advance in process techniques, a layout like the one shown in FIGS. 10 and 11 is not optimal. For example, the polysilicon wiring layers PL11 and PL12 are laid out translationally symmetric to each other with a T shape, resulting in a large wasteful region. Since the N-channel MOS transistors N1 and N3 are laid out to be perpendicular to each other, the diffusion layer is bent in an L shape, and the cell area is wasted.

FIGS. 13 and 14 show an improvement of the layout shown in FIGS. 10 and 11. The basic layout and geometrical shapes of the transistors N1 to N4 and P1 and P2 are the same as those in FIGS. 10 and 11 except that the metal wiring layer 2 replaces the polysilicon wiring layers PL11 and PL12 cross-connected in the layout shown in FIGS. 10 and 11, and along with this change, the metal wiring layer 3 constitutes the bit lines BL and /BL and the ground line GND. With the layout shown in FIGS. 13 and 14, the cell area decreases by about 10%, compared to the one shown in FIGS. 10 and 11.

Also in the layout shown in FIGS. 13 and 14, however, the diffusion layers respectively constituting the transistors N1 and N3 and the transistors N2 and N4 are inevitably formed into an L shape, wasting the cell area.

As described above, the layout of the SRAM cells shown in FIGS. 10 to 15 suffers the problems in which the geometrical shape such as the L shape of the diffusion layer is wasteful, and the element area is large.

SUMMARY OF THE INVENTION

It is, therefore, an object of the present invention to provide a layout structure for a semiconductor memory device in which the element area can be decreased by a metal wiring layer structure made up of three or more layers using the most advanced process techniques such as a trench element isolation technique and a stacked-via structure.

According to the present invention, there is provided a semiconductor memory device comprising a first inverter including a first N-channel MOS transistor and a first P-channel MOS transistor, a second inverter including a second N-channel MOS transistor and a second P-channel MOS transistor, and having an input terminal connected to an output terminal of the first inverter and an output terminal connected to an input terminal of the first inverter, a third N-channel MOS transistor having a source connected to the output terminal of the first inverter, a drain connected to a first bit line, and a gate connected to a word line, and a fourth N-channel MOS transistor having a source connected to an output terminal of the second inverter, a drain connected to a second bit line, and a gate connected to the word line, wherein a layout direction of a source and drain of each of the first, second, third, and fourth N-channel MOS transistors and the first and second P-channel MOS transistors is set parallel to a boundary between a P-well region where the first, second, third, and fourth N-channel MOS transistors are formed, and an N-well region where the first and second P-channel MOS transistors are formed.

The P-well region may be made up of first and second well regions, the first and second P-well regions may be laid out on two sides of the N-well region where the first and second P-channel MOS transistors are arranged, the first and third N-channel MOS transistors may be formed in the first P-well region, and the second and fourth N-channel MOS transistors may be formed in the second P-well region.

A first polysilicon wiring layer used for the gate of the third N-channel MOS transistor, and a second polysilicon wiring layer used for gates of the first N-channel MOS transistor and the first P-channel MOS transistor may be laid out parallel to each other, a third polysilicon wiring layer used for the gate of the fourth N-channel MOS transistor, and a fourth polysilicon wiring layer used for gates of the second N-channel MOS transistor and the second P-channel MOS transistor may be laid out parallel to each other, and the first and third polysilicon wiring layers may be formed to be isolated from each other, and electrically connected via contacts to a metal wiring layer constituting the word line.

The layout direction of the source and drain of each of the first, second, third, and fourth N-channel MOS transistors and the first and second P-channel MOS transistors may be set parallel to the bit line.

In addition, the second and third polysilicon wiring layers may be laid out to align on one straight line along a direction of the word line, and the first and fourth polysilicon wiring layers may be laid out to align on one straight line along a direction of the word line.

The first and third N-channel MOS transistors may be formed in the same diffusion layer within the first P-well region, and the second and fourth N-channel MOS transistors may be formed in the same diffusion layer within the second P-well region.

The first and third N-channel MOS transistors and the first P-channel MOS transistor, and the second and fourth N-channel MOS transistors and the first P-channel MOS transistor are desirably laid out to be point-symmetrical about a center of a memory cell.

The first and second bit lines, and a power supply line connected to the sources of the first and second P-channel MOS transistors may be made of second metal wiring layers, and the word line, and a ground line connected to the sources of the first and second N-channel MOS transistors may be made of third metal wiring layers.

The semiconductor memory device can have a layout in which the first polysilicon wiring layer used for the gate of the third N-channel MOS transistor, and the second polysilicon wiring layer used for the gates of the first N-channel MOS transistor and the first P-channel MOS transistor are laid out parallel to each other, the third polysilicon wiring layer used for the gate of the fourth N-channel MOS transistor, and the fourth polysilicon wiring layer used for the gates of the second N-channel MOS transistor and the second P-channel MOS transistor are laid out parallel to each other, the word line is divisionally formed by first and second metal wiring layers, and the first and third polysilicon wiring layers are formed to be isolated from each other, and electrically connected via a metal wiring layer and contacts to the first and second metal wiring layers.

It is also possible that first and second sense amplifiers are independently connected to the first and second bit lines, in a write, first and second word lines within the same cell are simultaneously selected, and in a read, the first and second word lines independently select different cells, and data read from the cells are output from the first and second sense amplifiers via the first and second bit lines.

In the present invention, although the N-channel MOS transistors are used as transistors between the first and second inverters and the first and second bit lines, these transistors may be made up of P-channel MOS transistors.

According to the semiconductor memory device of the present invention, the boundary between the P- and N-well regions where the inverters constituting a memory cell are formed is laid out parallel to the bit line. Accordingly, a diffusion layer in the P- or N-well region, and a cross-connection portion between the two inverters can be formed into simple shapes free from any bent portion, reducing the cell area.

BRIEF DESCRIPTION OF THE DRAWINGS

FIG. 9 is an explanatory view showing various marks of a contact, a via, a diffusion layer, and a wiring layer used in FIGS. 7 and 8;

DESCRIPTION OF THE PREFERRED EMBODIMENTS

An embodiment of the present invention will be described below with reference to the accompanying drawings.

Figure 1:
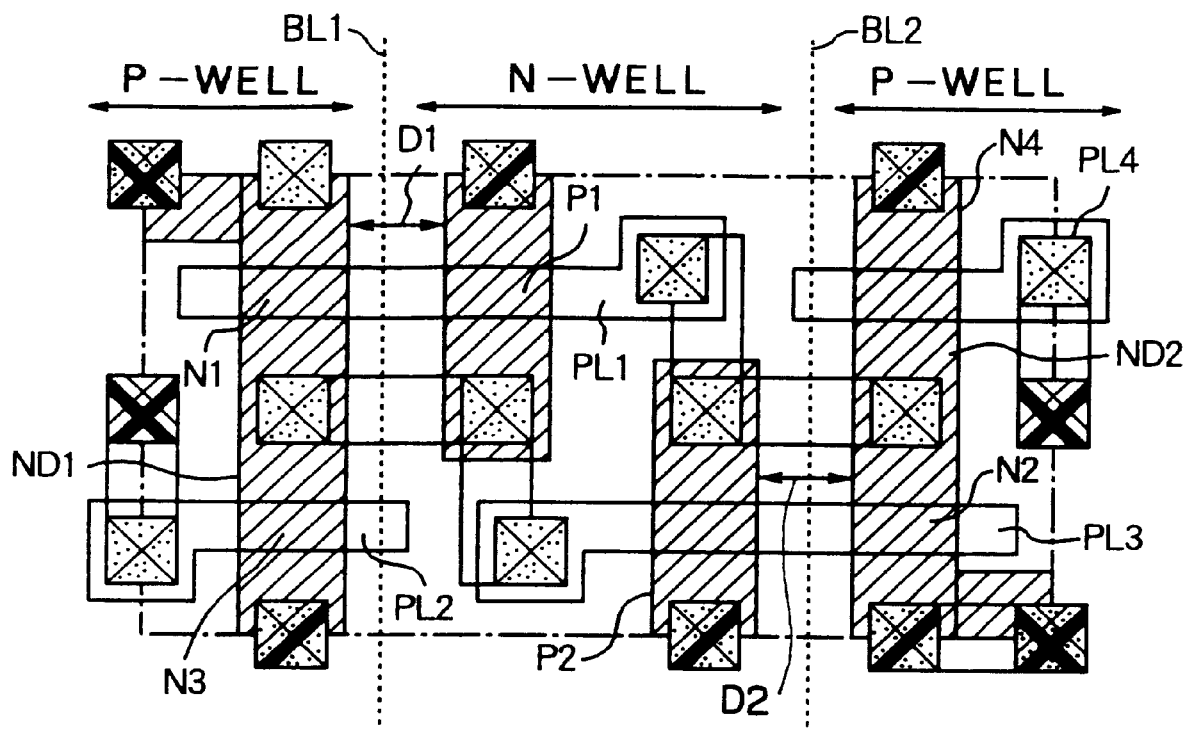
FIG. 1 is a plan view showing the layout of an underlying layer in a semiconductor memory device according to the first embodiment of the present invention.
Figure 2:
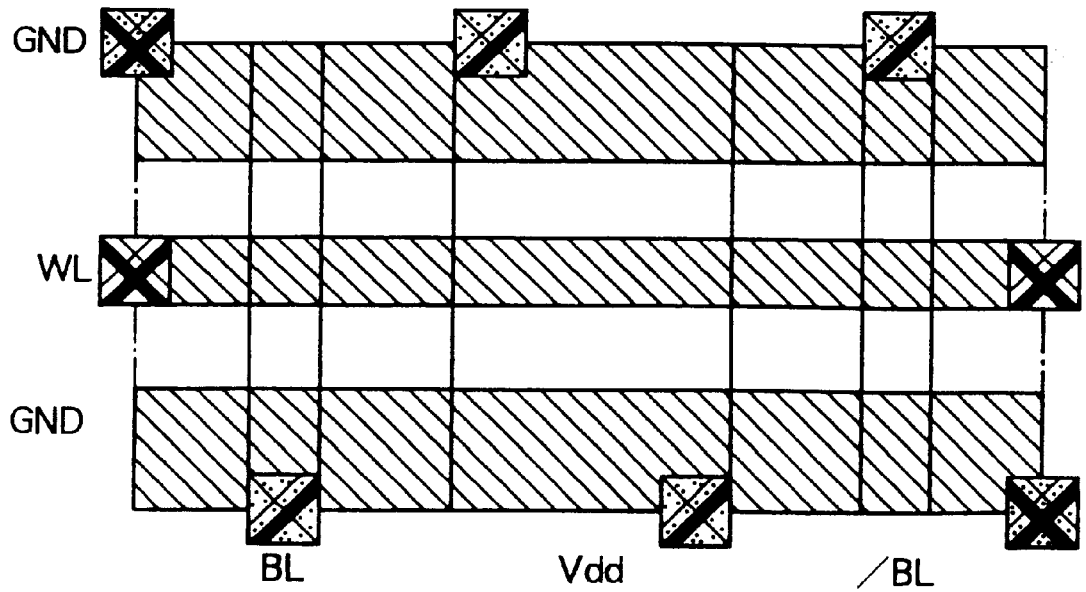
FIG. 2 is a plan view showing the layout of an overlying layer in the semiconductor memory device.
Figure 3A:
FIG. 3 is an explanatory view showing various marks of a contact, a via, a diffusion layer, and a wiring layer used in FIGS. 1 and 2.
Figure 3B:
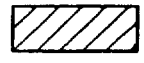
Figure 3C:
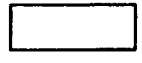

FIGS. 1 and 2 show the layout of an SRAM cell constituting a semiconductor memory device according to the first embodiment of the present invention. FIG. 1 shows an underlying layer including a diffusion layer formed on the surface of a semiconductor substrate, a polysilicon film formed on the upper surface of the diffusion layer, and a metal wiring layer 1. FIG. 2 shows an overlying layer including metal wiring layers 2 and 3 formed on the upper surface of the underlying layer. Various marks in FIG. 3(a) denote a cell boundary, a contact, and vias 1 and 2; those in FIG. 3(b), a diffusion layer, a polysilicon film, and the metal wiring layer 1; and those in FIG. 3(c), the metal wiring layers 2 and 3.

As shown in FIG. 1, an N-well region where P-channel MOS transistors P1 and P2 are formed is laid out at the center. A P-well region where N-channel MOS transistors N1 and N3 are formed, and a P-well region where N-channel MOS transistors N2 and N4 are formed are laid out on the two sides of the N-well region.

The gate of the word line transistor N3 and the gate of the transistor N4 which are connected to a word line WL are made of isolated polysilicon wiring layers, and separately connected via stacked vias to the word line WL formed of the metal wiring layer 3. As shown in FIG. 2, bit lines BL and /BL are individually formed of the metal wiring layers 2. A power supply line Vdd is formed of the metal wiring layer 2 at a central portion between the bit lines BL and /BL to be parallel to the bit line. The word line WL is formed of the metal wiring layer 3 in a direction perpendicular to the bit lines BL and /BL. A ground line GND is formed of the two metal wiring layers 3 on the two sides of the word line WL to be parallel to the word line WL. The contact of the P-well region to the substrate electrically connects the grounded metal wiring layer 3 to the diffusion layer within the P-well region through a stacked-via structure made up of "contact+via 1+via 2".

In the layout shown in FIGS. 10 and 11 or FIGS. 13 and 14, the boundary BL11 or BL12 between the N- and P-well regions runs perpendicular to the bit lines BL and /BL. In the layout of the first embodiment, boundaries BL11 and BL12 between the N- and P-well regions run parallel to the bit lines BL and /BL. With this layout, the P-channel MOS transistor P1 and the N-channel MOS transistor N1 which constitute an inverter over the boundary between the well regions having different conductivity types can be laid out parallel to the N-channel MOS transistor N3 serving as a transfer gate transistor. As a result, an n-type diffusion layer ND1 within the P-well region where the transistors N1 and N3 are formed, and an n-type diffusion layer ND2 in the P-well region where the transistors N2 and N4 are formed can be formed straight parallel to the bit lines BL and /BL without being bent, preventing generation of a wasteful region.

In the first embodiment, one inverter made up of the transistors P1 and N1 and the transfer gate transistor N3, and the other inverter made up of the transistors P2 and N2 and the transfer gate transistor N4 are respectively arranged point-symmetrically about the center of the SRAM cell. With this layout, in cross-connecting the two inverters, wiring lines internally connecting the gates and drains of the transistors P1, P2, N1, and N2 need not be connected to cross the space, and the wiring region can be reduced.

A polysilicon wiring layer PL1 for the transistors N1 and P1 and a polysilicon wiring layer PL2 for the transistor N4 can be arranged on one straight line parallel to the word line WL. Similarly, the polysilicon wiring layer PL2 for the transistors N3 and P2 and a polysilicon wiring layer PL4 for the transistor N2 can be arranged on one straight line parallel to the word line WL. That is, all the polysilicon wiring layers PL1 to PL4 and the metal wiring layers 2 and 3 are parallel to each other, and the diffusion layers ND1 and ND2 are laid out perpendicularly to them, eliminating formation of the bent portion present in the conventional layout.

In this layout, as shown in FIG. 1, two isolation regions are present between the two P-well regions and the N-well region. However, since the element isolation width between well regions having different conductivity types can be decreased to be almost equal to that between well regions having the same conductivity type by using a trench element isolation technique, an increase in cell area can be suppressed. As a result, according to the first embodiment, the area can be decreased by about 35%, compared to the conventional layout shown in FIGS. 10 and 11.

According to the first embodiment, not only the cell area decreases, but also the noise reduces owing to the following reason. In the layout according to this embodiment, the length in the lateral direction (x direction) of the cell, i.e., the length in the direction of the word line WL is relatively larger than the length in the longitudinal direction (y direction), i.e., the length in the direction of the bit lines BL and /BL. This facilitates the layout of sense amplifiers arranged every pitch in the x direction of the cell and connected to the bit lines BL and /BL.

Since the cell shape is relatively longer in the x direction than in the y direction, the number of cells connected in the direction of the word line WL decreases, compared to the conventional layout. As the number of cells connected to one word line is smaller, the cell current flowing in a read decreases. Therefore, according to the first embodiment, the power consumption can be reduced.

In a logical IC, many wiring resources in the direction of the bit lines BL and /BL per cell can be obtained due to the following reason though a bus line often runs using the fourth metal wiring layer on the memory cell. More specifically, when the bus line runs on the memory cell, if the bit lines BL and /BL and the bus line are laid out to run vertically parallel to each other over a long distance, a change in signal on the bus line becomes capacitive coupling noise, which is superposed on the bit lines BL and /BL to cause an operation error. In the first embodiment, since the bus line is laid out parallel to the bit lines BL and /BL except for portions immediately above the bit lines BL and /BL, such an operation error can be prevented. The bit lines BL and /BL are made of the metal wiring layers 2. The ground line GND and the word line WL made of the metal wiring layers 3 are present between the bit lines BL and /BL, and a bus line made of a metal wiring layer 4 and running on the memory cell, and function as a metal blocking layer. For this reason, occurrence of an operation error can be reliably prevented.

Figure 4:
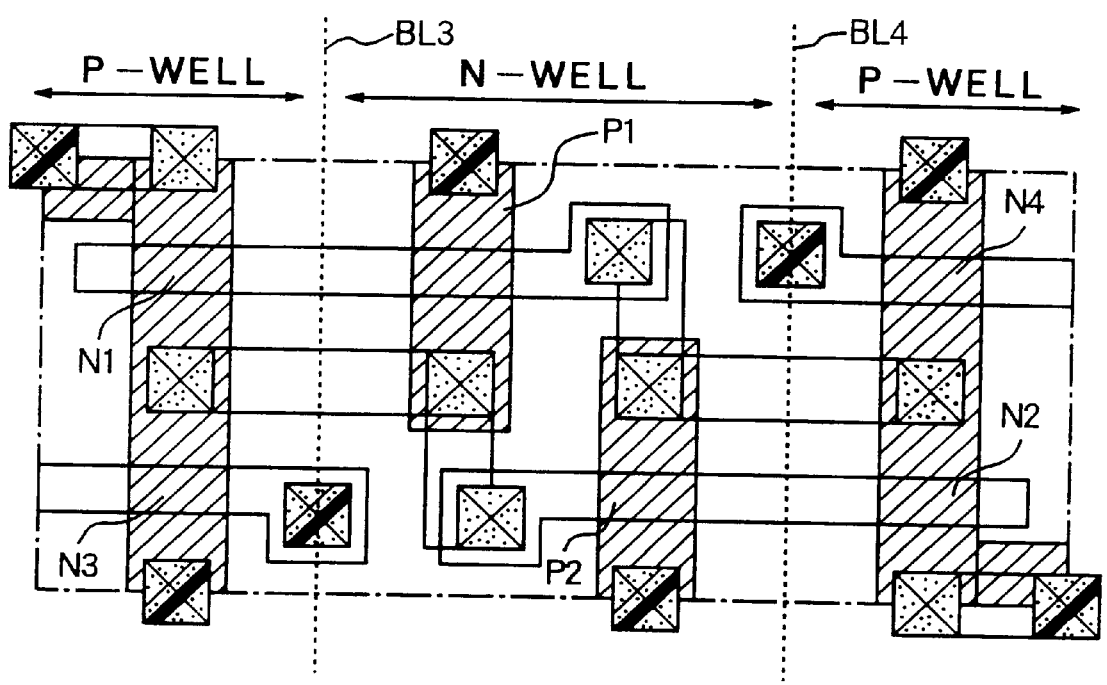
FIG. 4 is a plan view showing the layout of an underlying layer in a semiconductor memory device according to the second embodiment of the present invention.
Figure 5:
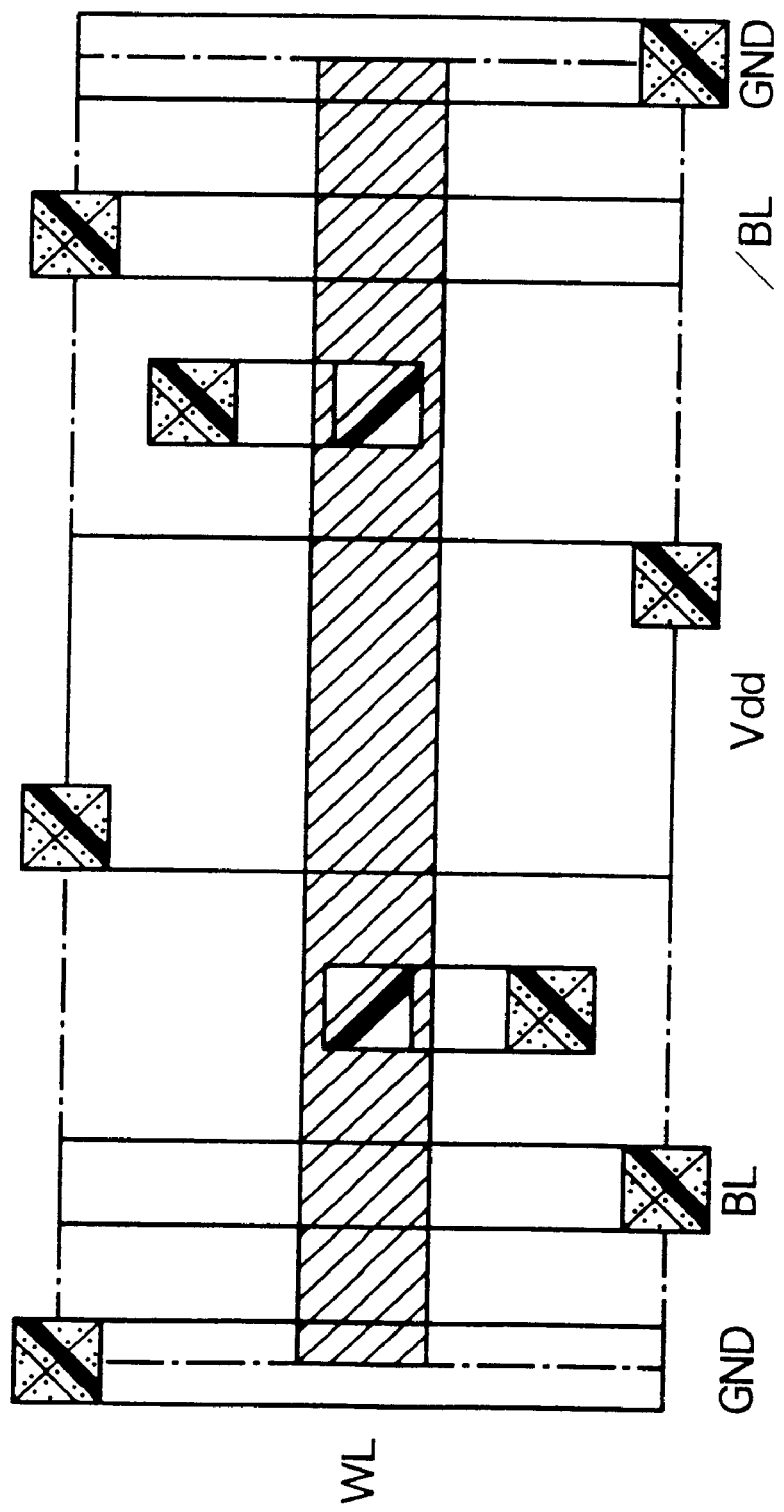
FIG. 5 is a plan view showing the layout of an overlying layer in the semiconductor memory device.
Figure 6A:
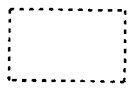
FIG. 6 is an explanatory view showing various marks of the contact, the via, the diffusion layer, and the wiring layer used in FIGS. 4 and 5.
Figure 6B:
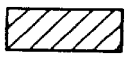

FIGS. 4 and 5 show the layout of a semiconductor memory device according to the second embodiment of the present invention. Marks used are shown in FIGS. 6(a) to 6(c).

The second embodiment is different from the first embodiment in that a region where a word line WL formed of a metal wiring layer 3 contacts a polysilicon wiring layer is set in a P-well region, and a ground line GND and a power supply line Vdd made of metal wiring layers 2 are arranged parallel to bit lines BL and /BL. The layout according to the second embodiment is suitable for the case wherein the isolation width of the well region is relatively larger than the element isolation width. In addition to the above effects of the first embodiment, the following effects unique to the second embodiment can be obtained.

When the power supply line Vdd and the ground line GND are laid out parallel to the word line WL, a current flowing through all cells connected to a selected word line flows into one power supply line Vdd and one ground line GND. To the contrary, if the power supply line Vdd and the ground line GND run parallel to the bit lines BL and /BL, as in the second embodiment, a current flowing through the power supply line Vdd and the ground line GND in a cell read or write can be limited to one cell. As a result, according to the second embodiment, the operation margin for electromigration and voltage drop on the power supply line Vdd and the ground line GND can be set larger than that in the first embodiment.

Figure 7:
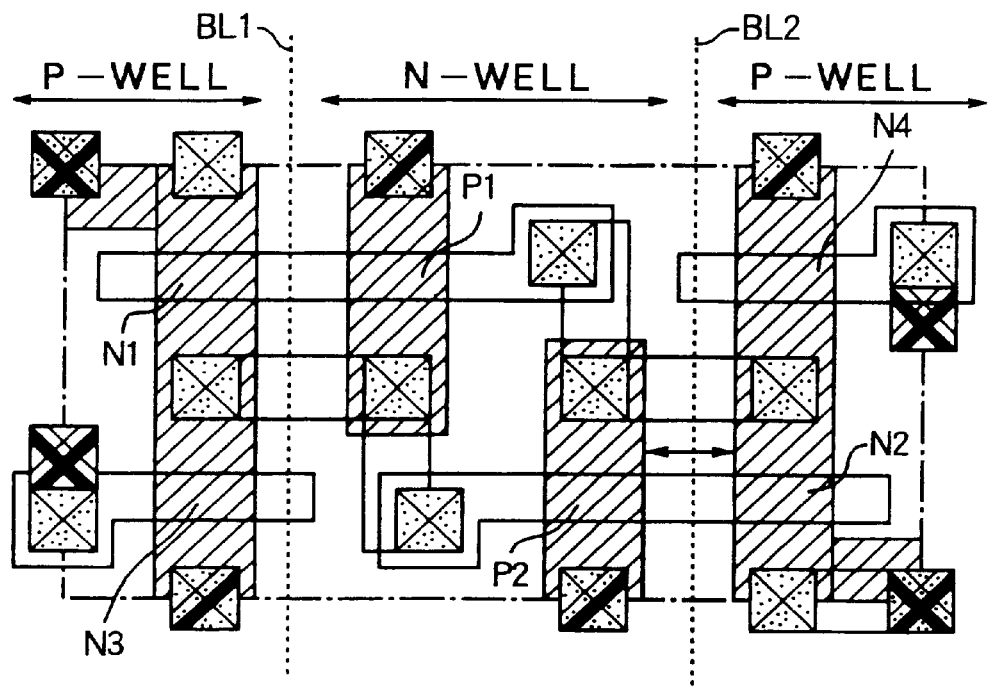
FIG. 7 is a plan view showing the layout of an underlying layer in a semiconductor memory device according to the third embodiment of the present invention.
Figure 8:
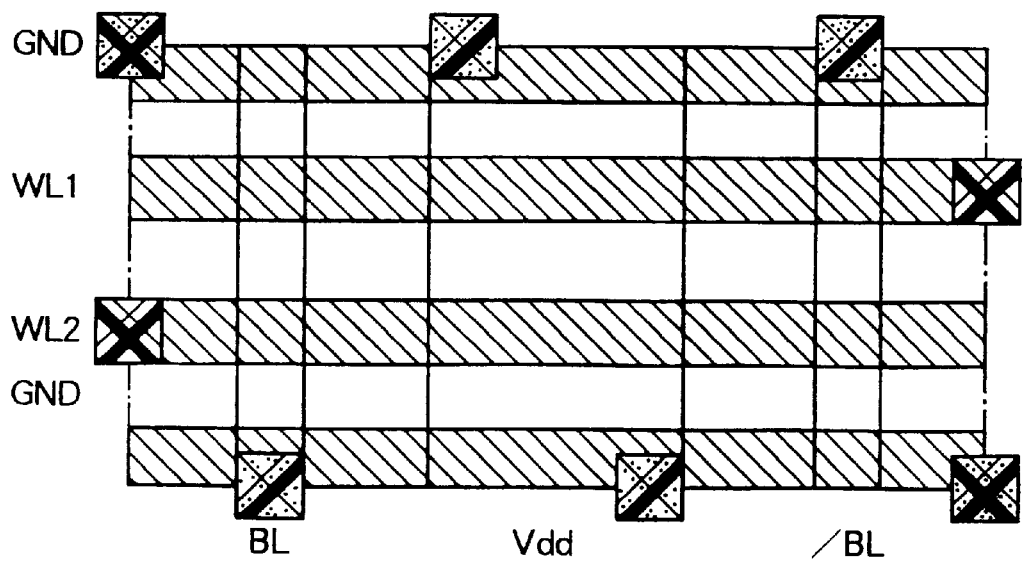
FIG. 8 is a plan view showing the layout of an overlying layer in the semiconductor memory device.
Figure 10:
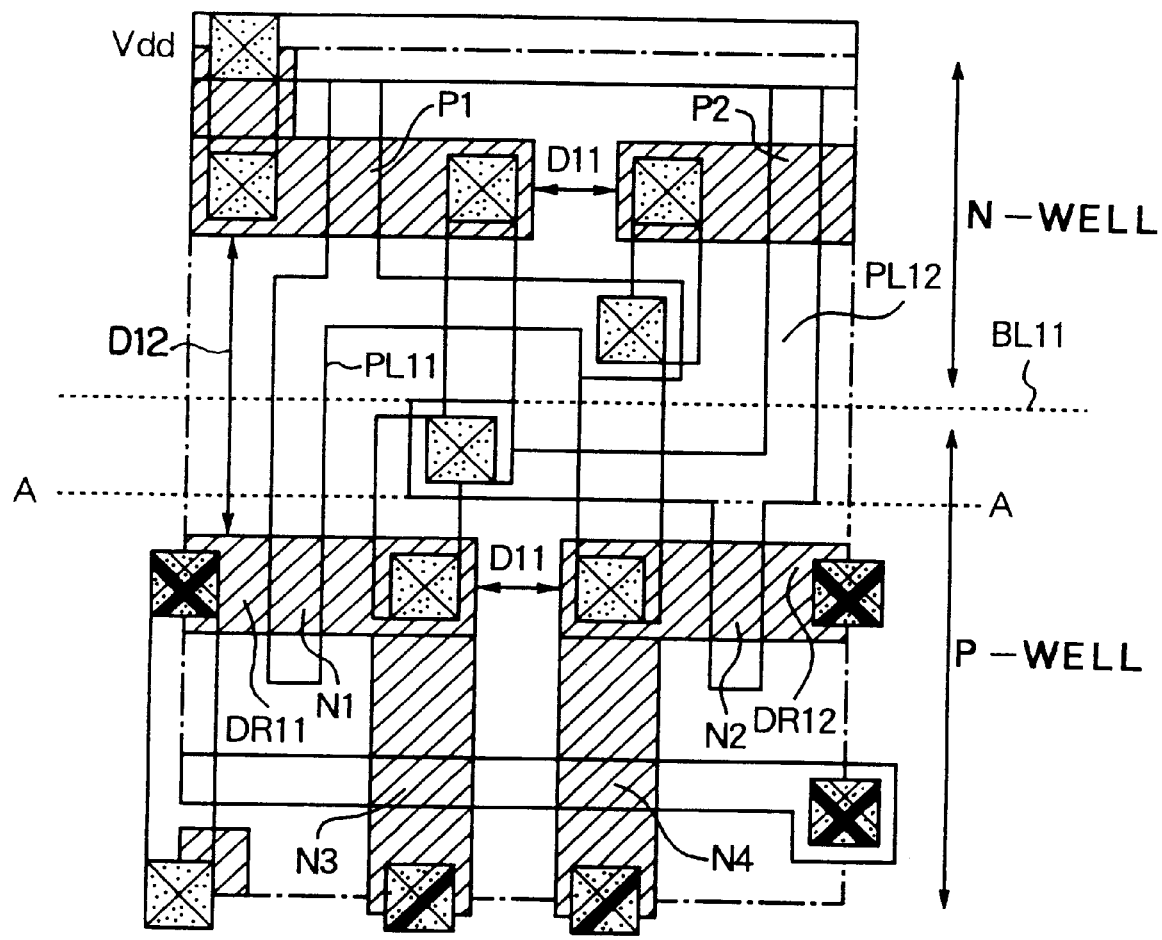
FIG. 10 is a plan view showing the layout of an underlying layer in a conventional semiconductor memory device.
Figure 11:
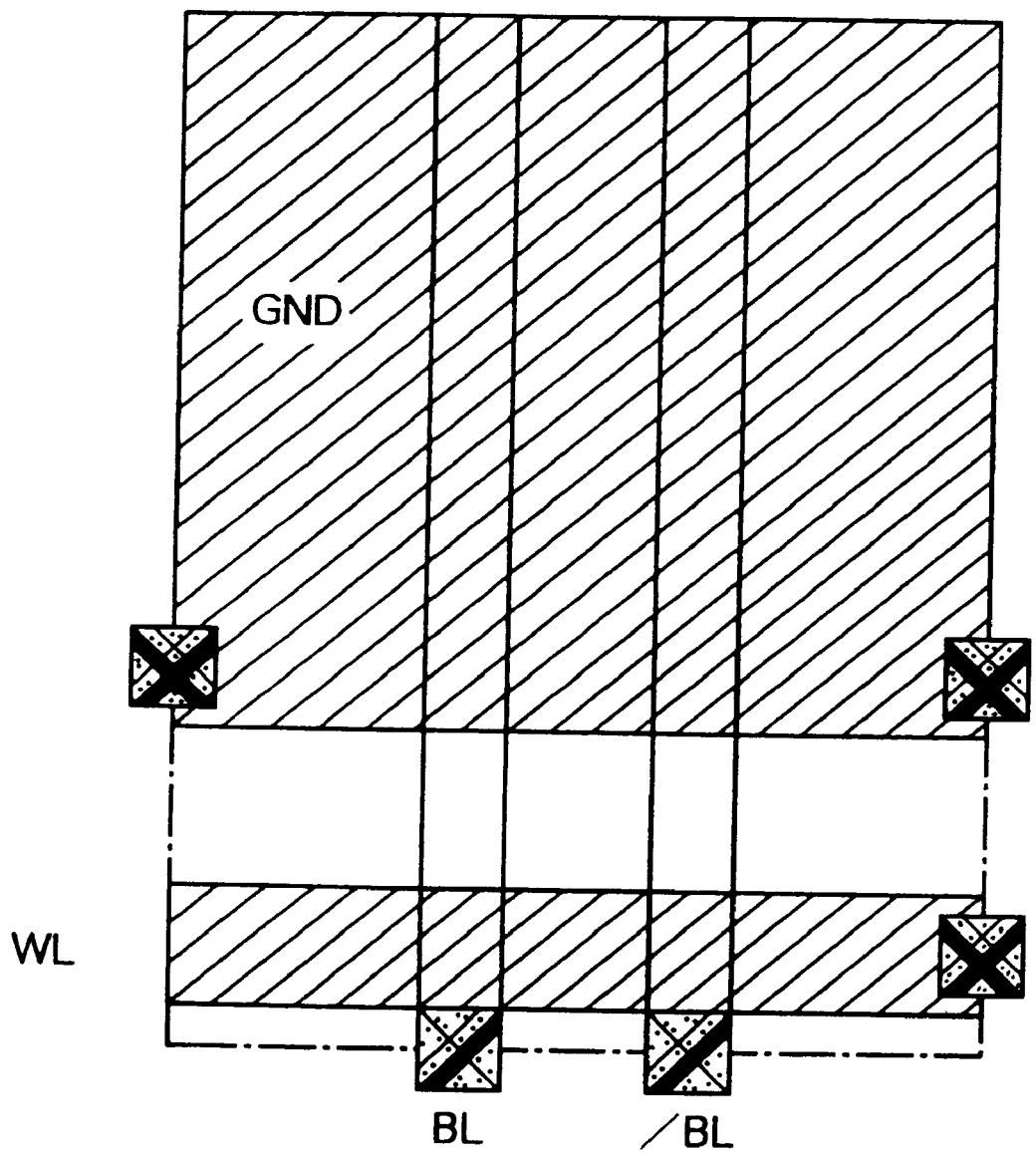
FIG. 11 is a plan view showing the layout of an overlying layer in the semiconductor memory device.
Figure 12A:
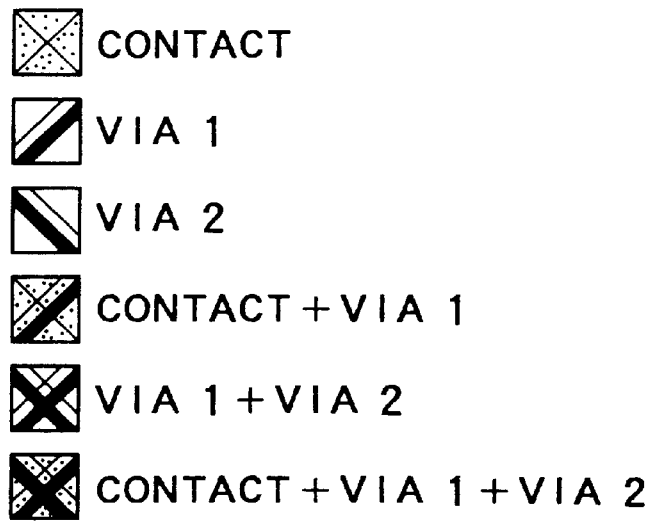
FIG. 12 is an explanatory view showing various marks of a contact, a via, a diffusion layer, and a wiring layer used in FIGS. 10 and 11.
Figure 12B:
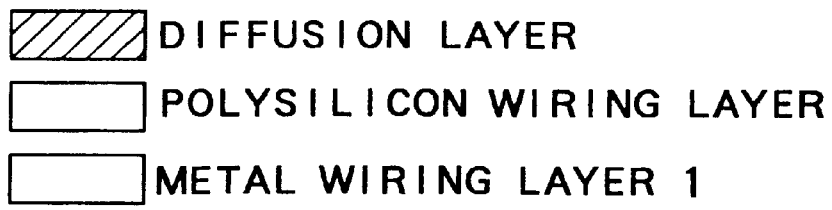
Figure 12C:
Figure 13:
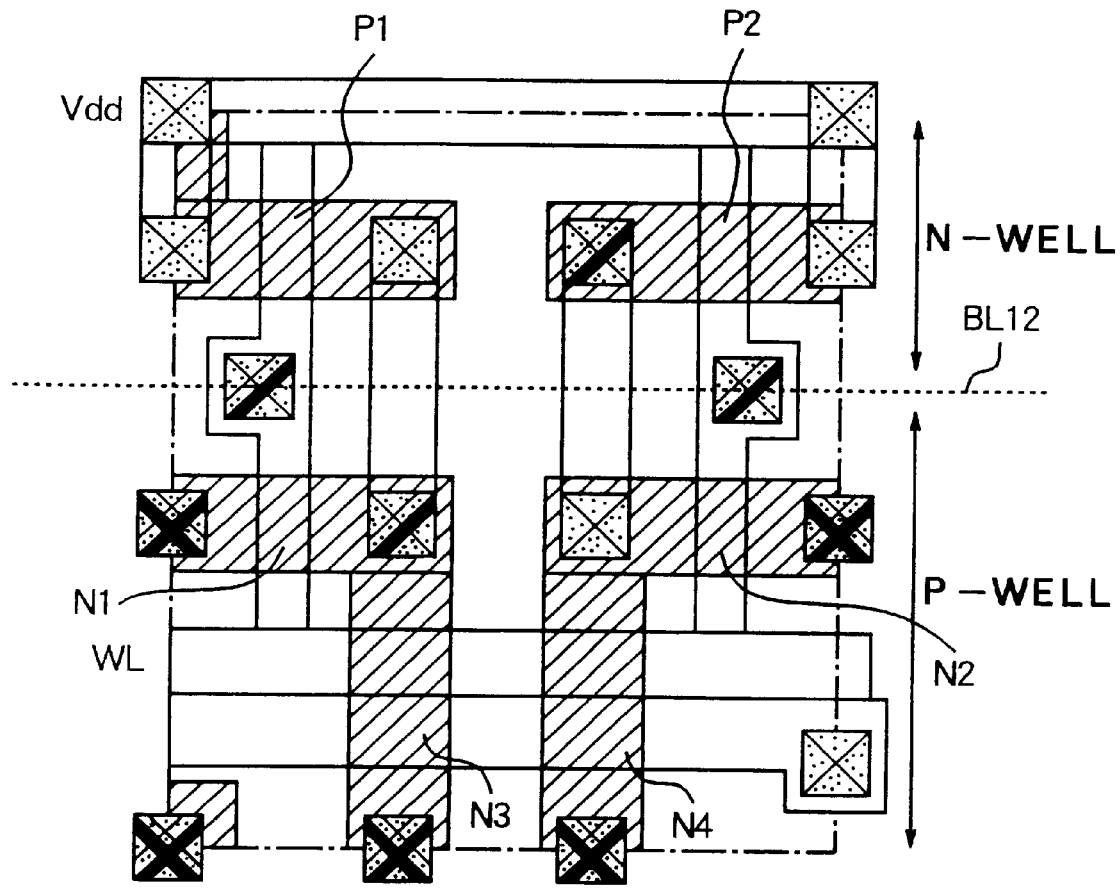
FIG. 13 is a plan view showing the layout of an underlying layer in a semiconductor memory device associated with the present invention.
Figure 14:
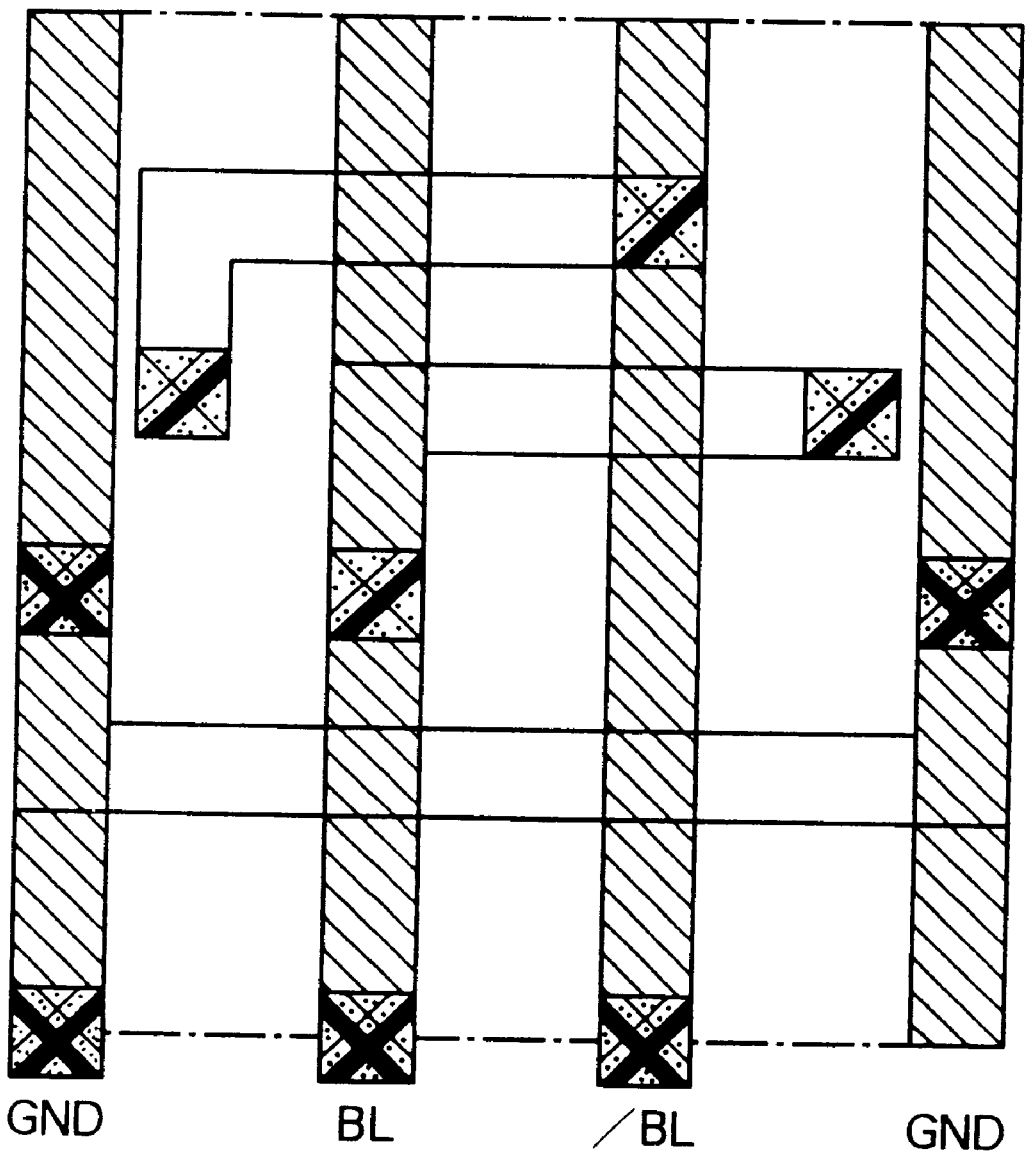
FIG. 14 is a plan view showing the layout of an overlying layer in the semiconductor memory device associated with the present invention.
Figure 15A:
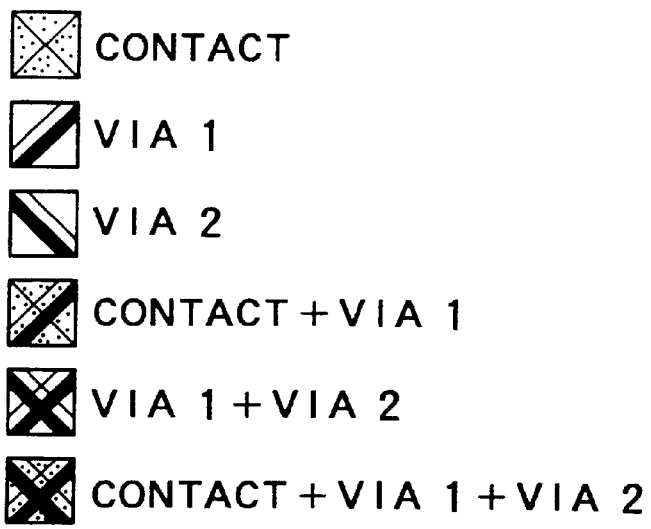
FIG. 15 is an explanatory view showing various marks of a contact, a via, a diffusion layer, and a wiring layer used in FIGS. 13 and 14.
Figure 15B:
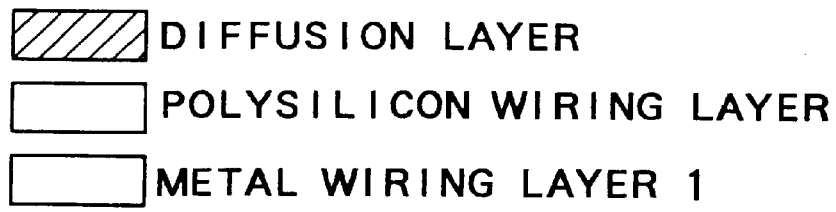
Figure 15C:

The layout of a semiconductor memory device according to the third embodiment of the present invention will be described with reference to FIGS. 7 to 9. The third embodiment is different from the second embodiment in that two word lines WL1 and WL2 made of metal wiring layers 3 are formed, and the gates of transistors N3 and N4 are respectively connected to the different word lines WL1 and WL2. By arranging the two word lines WL1 and WL2 in this manner, the transistors N3 and N4 can be independently controlled within one cell to read data from different cells to a pair of bit lines BL and /BL. If sense amplifiers are individually connected to the bit lines BL and /BL, data can be read from the semiconductor memory device as a 2-port memory though the read is a single-end one. In a write, the same cell is selected for the word lines WL1 and WL2 to operate the semiconductor memory device as a 1-port memory. In this manner, according to the third embodiment, the semiconductor memory device serving as a 2-port memory in a read and a 1-port memory in a write can be realized with the same cell area as that of a normal 1-port memory.

Figure 16:
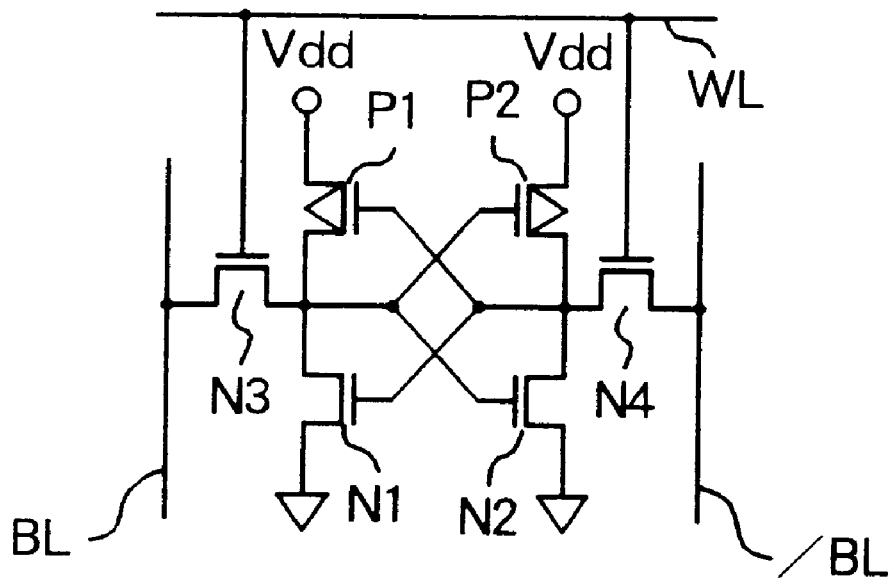
FIG. 16 is a circuit diagram showing the arrangement of a normal SRAM cell.
Figure 17:
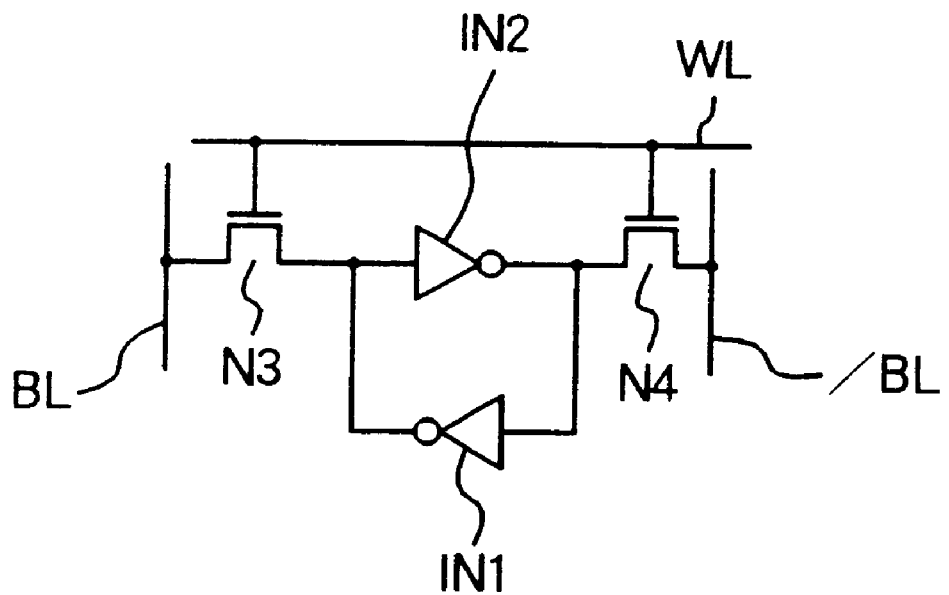
FIG. 17 is a circuit diagram showing a circuit arrangement electrically equivalent to the SRAM cell.
Figure 21:
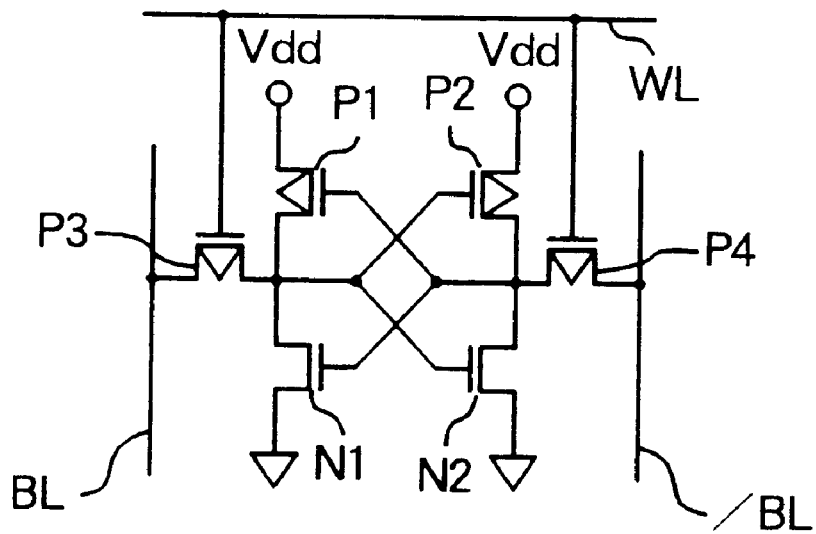
FIG. 21 is a circuit diagram showing the circuit arrangement of an SRAM cell in the semiconductor memory device according to the fourth embodiment of the present invention.
Figure 22:
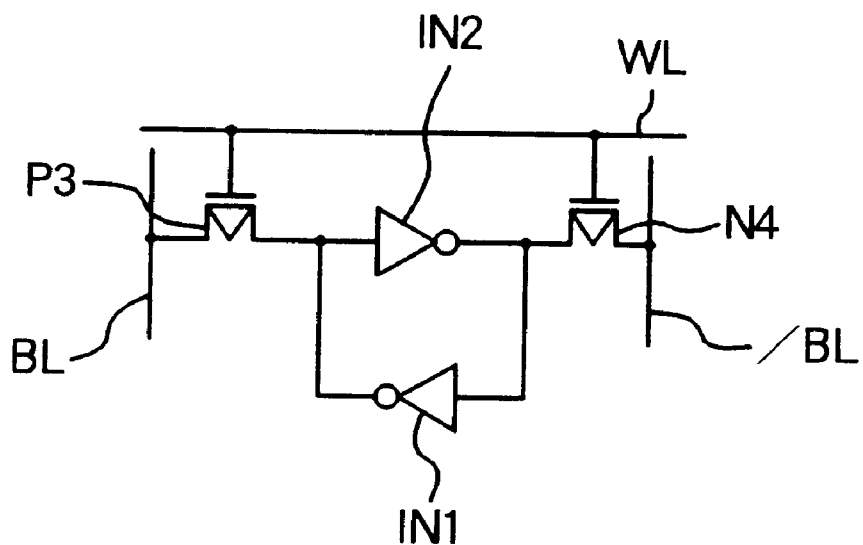
FIG. 22 is a circuit diagram showing a circuit arrangement electrically equivalent to the SRAM cell.

The above-mentioned embodiments are merely examples, and do not limit the present invention. For example, in the semiconductor memory device according to the first to third embodiments, the transfer gate transistors are made up of the N-channel MOS transistors N3 and N4, as shown in FIGS. 16 and 17. However, as shown in FIGS. 21 and 22, the transfer gate transistors may be made up of P-channel MOS transistors P3 and P4 to constitute one SRAM with the four P-channel MOS transistors P1 to P4 and the two N-channel MOS transistors N1 and N2. In this case, as the layout, a P-well region is laid out at the center, and two N-well regions are laid out on the two sides of the P-well region on the underlying layer, whereas the power supply line Vdd and the ground line GND are exchanged with each other on the overlying layer.

Figure 18:
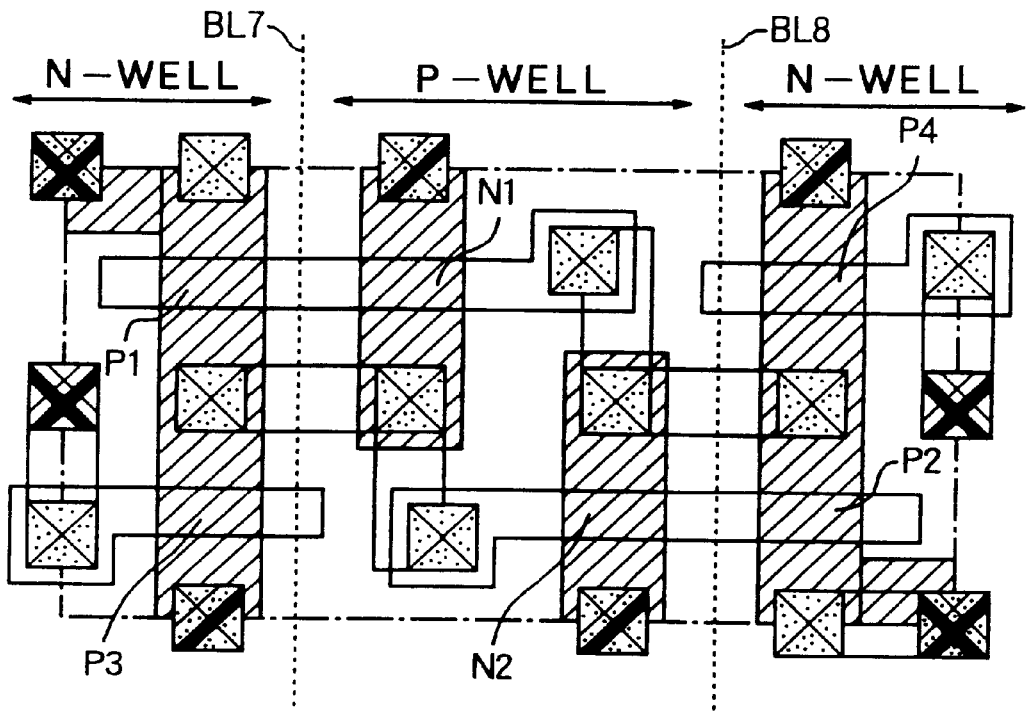
FIG. 18 is a plan view showing the layout of an underlying layer in a semiconductor memory device according to the fourth embodiment of the present invention.
Figure 19:
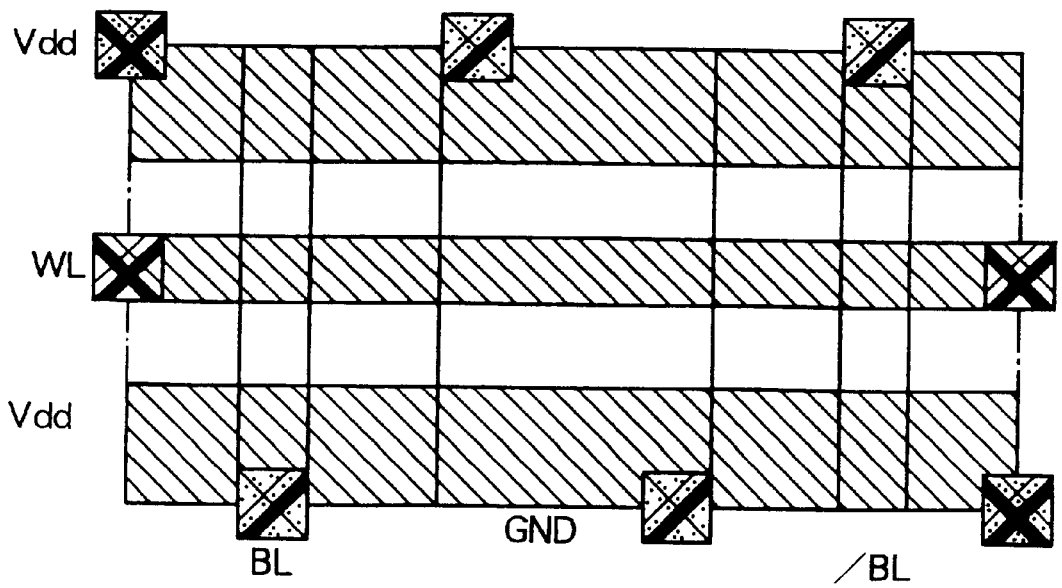
FIG. 19 is a plan view showing the layout of an overlying layer in the semiconductor memory device.
Figure 20A:
FIG. 20 is an explanatory view showing various marks of a contact, a via, a diffusion layer, and a wiring layer used in FIGS. 18 and 19.
Figure 20A:
Figure 20A:
Figure 20A:
Figure 20A:
Figure 20A:
Figure 20A:
Figure 20B:
Figure 20B:
Figure 20B:
Figure 20C:
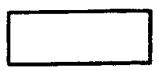
Figure 20C:

FIGS. 18 and 19 show a layout employed when the transfer gate transistors in the first embodiment are made up of the P-channel MOS transistors P3 and P4. On the overlying layer, the N-channel MOS transistors N1 and N2 are formed in one P-well region, and an N-well region where the P-channel MOS transistors P1 and P3 are formed, and an N-well region where the P-channel MOS transistors P2 and P4 are formed are laid out on the two sides of the N-well region. On the underlying layer, the power supply line Vdd and the ground line GND exchange with each other. Similarly, the transfer gate transistors can be made up of P-channel MOS transistors in the second and third embodiments.

What is claimed is:

1. A semiconductor memory device comprising:
   a first inverter including a first N-channel MOS transistor and a first P-channel MOS transistor;
   a second inverter including a second N-channel MOS transistor and a second P-channel MOS transistor, and having an input terminal connected to an output terminal of said first inverter and an output terminal connected to an input terminal of said first inverter;
   a third N-channel MOS transistor having a source connected to the output terminal of said first inverter, a drain connected to a first bit line, and a gate connected to a word line; and a fourth N-channel MOS transistor having a source connected to an output terminal of said second inverter, a drain connected to a second bit line, and a gate connected to said word line, wherein a layout direction of a source and drain of each of said first, second, third, and fourth N-channel MOS transistors and said first and second P-channel MOS transistors is set parallel to a boundary between a P-well region where said first, second, third, and fourth N-channel MOS transistors are formed, and an N-well region where said first and second P-channel MOS transistors are formed.

2. A device according to claim 1, wherein the layout direction of the source and drain of each of said first, second, third, and fourth N-channel MOS transistors and said first and second P-channel MOS transistors is set parallel to said bit line.

3. A device according to claim 1, wherein the P-well region is made up of first and second well regions, and the first and second P-well regions are laid out on both sides of the N-well region where said first and second P-channel MOS transistors are arranged, and said first and third N-channel MOS transistors are formed in the first P-well region, and said second and fourth N-channel MOS transistors are formed in the second P-well region.

4. A device according to claim 3, wherein the layout direction of the source and drain of each of said first, second, third, and fourth N-channel MOS transistors and said first and second P-channel MOS transistors is set parallel to said bit line.

5. A device according to claim 4, wherein a first polysilicon wiring layer used for the gate of said third N-channel MOS transistor, and a second polysilicon wiring layer used for gates of said first N-channel MOS transistor and said first P-channel MOS transistor are laid out parallel to each other, a third polysilicon wiring layer used for the gate of said fourth N-channel MOS transistor, and a fourth polysilicon wiring layer used for gates of said second N-channel MOS transistor and said second P-channel MOS transistor are laid out parallel to each other, and said first and third polysilicon wiring layers are formed to be isolated from each other, and electrically connected via contacts to a metal wiring layer constituting said word line.

6. A device according to claim 5, wherein the layout direction of the source and drain of each of said first, second, third, and fourth N-channel MOS transistors and said first and second P-channel MOS transistors is set parallel to said bit line.

7. A device according to claim 5, wherein said second and third polysilicon wiring layers are laid out to align on one straight line along a direction of said word line, and said first and fourth polysilicon wiring layers are laid out to align on one straight line along a direction of said word line.

8. A device according to claim 7, wherein said first and third N-channel MOS transistors are formed in the same diffusion layer within the first P-well region, and said second and fourth N-channel MOS transistors are formed in the same diffusion layer within the second P-well region.

9. A device according to claim 8, wherein said first and third N-channel MOS transistors and said first P-channel MOS transistor, and said second and fourth N-channel MOS transistors and said first P-channel MOS transistor are laid out to be point-symmetrical about a center of a memory cell.

10. A device according to claim 9, wherein said first and second bit lines, and a power supply line connected to the sources of said first and second P-channel MOS transistors are made of second metal wiring layers, and said word line, and a ground line connected to the sources of said first and second N-channel MOS transistors are made of third metal wiring layers.

11. A device according to claim 10, wherein said first polysilicon wiring layer used for the gate of said third N-channel MOS transistor, and said second polysilicon wiring layer used for the gates of said first N-channel MOS transistor and said first P-channel MOS transistor are laid out parallel to each other, said third polysilicon wiring layer used for the gate of said fourth N-channel MOS transistor, and said fourth polysilicon wiring layer used for the gates of said second N-channel MOS transistor and said second P-channel MOS transistor are laid out parallel to each other, said word line is divisionally formed by first and second metal wiring layers, and said first and third polysilicon wiring layers are formed to be isolated from each other, and electrically connected via a metal wiring layer and contacts to said first and second metal wiring layers.

12. A device according to claim 11, wherein first and second sense amplifiers are independently connected to said first and second bit lines, in a write, first and second word lines within the same cell are simultaneously selected, and in a read, said first and second word lines independently select different cells, and data read from the cells are output from said first and second sense amplifiers via said first and second bit lines.

13. A semiconductor memory device comprising:

a first inverter including a first N-channel MOS transistor and a first P-channel MOS transistor;

a second inverter including a second N-channel MOS transistor and a second P-channel MOS transistor, and having an input terminal connected to an output terminal of said first inverter and an output terminal connected to an input terminal of said first inverter;

a third P-channel MOS transistor having a drain connected to the output terminal of said first inverter, a source connected to a first bit line, and a gate connected to a word line; and a fourth P-channel MOS transistor having a drain connected to an output terminal of said second inverter, a source connected to a second bit line, and a gate connected to said word line, wherein a layout direction of a source and drain of each of said first and second N-channel MOS transistors and said first, second, third, and fourth P-channel MOS transistors is set parallel to a boundary between a P-well region where said first and second N-channel MOS transistors are formed, and an N-well region where said first, second, third, and fourth P-channel MOS transistors are formed.

\* \* \* \* \*